(12) United States Patent
Ping et al.

(10) Patent No.: US 6,344,418 B1
(45) Date of Patent: Feb. 5, 2002

(54) METHODS OF FORMING HEMISPHERICAL GRAIN POLYSILICON

(75) Inventors: Er-Xuan Ping, Boise; Li Li, Meridian, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/501,802

(22) Filed: Feb. 9, 2000

Related U.S. Application Data

(63) Continuation of application No. 09/018,228, filed on Feb. 3, 1998, now Pat. No. 6,083,849, which is a continuation-in-part of application No. 08/659,145, filed on Jun. 5, 1996, now Pat. No. 5,783,495, which is a continuation-in-part of application No. 08/559,188, filed on Nov. 13, 1995, now abandoned.

(51) Int. Cl.⁷ .............................................. H01L 21/00
(52) U.S. Cl. .................................... 438/753; 438/745
(58) Field of Search ............................. 438/715, 735, 438/738, 758, 753, 778, 795, 745; 216/99; 134/3

(56) References Cited

U.S. PATENT DOCUMENTS

| | | | |
|---|---|---|---|
| 3,753,196 A | 8/1973 | Kunz et al. .................... 338/4 |
| 3,925,804 A | 12/1975 | Cricchi et al. | |
| 4,100,014 A | 7/1978 | Kunh-Kuhnenfeld et al. ........ 156/647 |
| 4,120,744 A | 10/1978 | Payne et al. | |
| 4,671,850 A | 6/1987 | Shimkunai .................. 156/643 |
| 4,857,142 A | 8/1989 | Syverson ..................... 156/646 |
| 4,902,642 A | 2/1990 | Mao et al. | |
| 4,978,634 A | 12/1990 | Shen et al. ..................... 437/52 |
| 4,996,627 A | 2/1991 | Zias et al. ................... 361/283 |
| 5,110,752 A | 5/1992 | Lu ............................... 437/47 |
| 5,129,955 A | 7/1992 | Tanaka .......................... 134/2 |
| 5,223,081 A | 6/1993 | Doan .......................... 156/628 |
| 5,259,888 A | 11/1993 | McCoy ........................... 134/2 |
| 5,290,361 A | 3/1994 | Hayashida et al. ............ 134/2 |
| 5,294,568 A | 3/1994 | McNeilly et al. ........... 437/235 |
| 5,326,722 A | 7/1994 | Huang ........................ 437/186 |
| 5,328,867 A | 7/1994 | Chien et al. ................ 437/191 |
| 5,352,623 A | 10/1994 | Kamiyama ................... 437/52 |
| 5,372,962 A | 12/1994 | Hirota et al. ................. 437/47 |
| 5,472,513 A | 12/1995 | Shiramira ...................... 134/3 |
| 5,554,566 A | 9/1996 | Lur et al. .................... 437/193 |
| 5,571,375 A | 11/1996 | Izumi et al. ............. 156/646.1 |
| 5,632,854 A | 5/1997 | Mirga et al. .................. 435/53 |
| 5,634,974 A | 6/1997 | Weimer et al. ............. 117/103 |
| 5,691,228 A | 11/1997 | Ping et al. .................... 437/60 |
| 5,766,969 A | 6/1998 | Fulford, Jr. et al. | |
| 5,780,315 A | * 7/1998 | Chao et al. ..................... 438/9 |
| 5,785,495 A | 7/1998 | Li et al. ..................... 438/738 |
| 5,871,658 A | * 2/1999 | Tao et al. .................. 438/9 X |

OTHER PUBLICATIONS

Wolf et al., "Silicon Processing for the VLSI Era," Jan. 1986, pp. 532–534.

* cited by examiner

*Primary Examiner*—William A. Powell
(74) *Attorney, Agent, or Firm*—Wells, St. John, Roberts, Gregory & Matkin

(57) ABSTRACT

In one aspect, the invention encompasses a semiconductor processing method comprising contacting a surface with a liquid solution comprising at least one fluorine-containing species and a temperature of at least about 40° C. In another aspect, the invention encompasses a method of passivating a silicon-comprising layer comprising contacting the layer with a liquid solution comprising hydrogen fluoride and a temperature of at least about 40° C. In yet another aspect, the invention encompasses a method of forming hemispherical grain polysilicon comprising: a) forming a layer comprising substantially amorphous silicon over a substrate; b) contacting the layer comprising substantially amorphous silicon with a liquid solution comprising fluorine-containing species and a temperature of at least about 40° C.; c) seeding the layer comprising substantially amorphous silicon; and d) annealing the seeded layer to convert at least a portion of the seeded layer to hemispherical grain polysilicon.

18 Claims, 4 Drawing Sheets

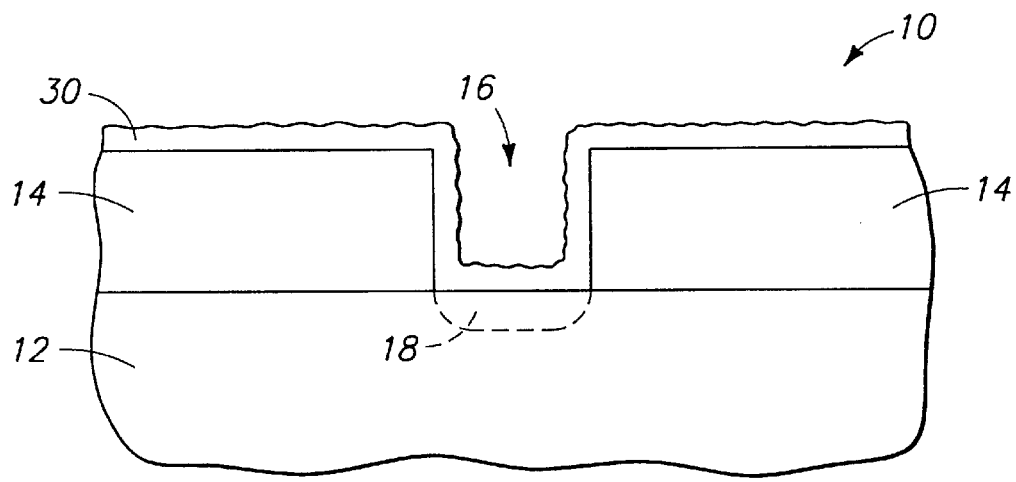
$\mathbb{F}\mathbb{I}\mathbb{G}$ 3
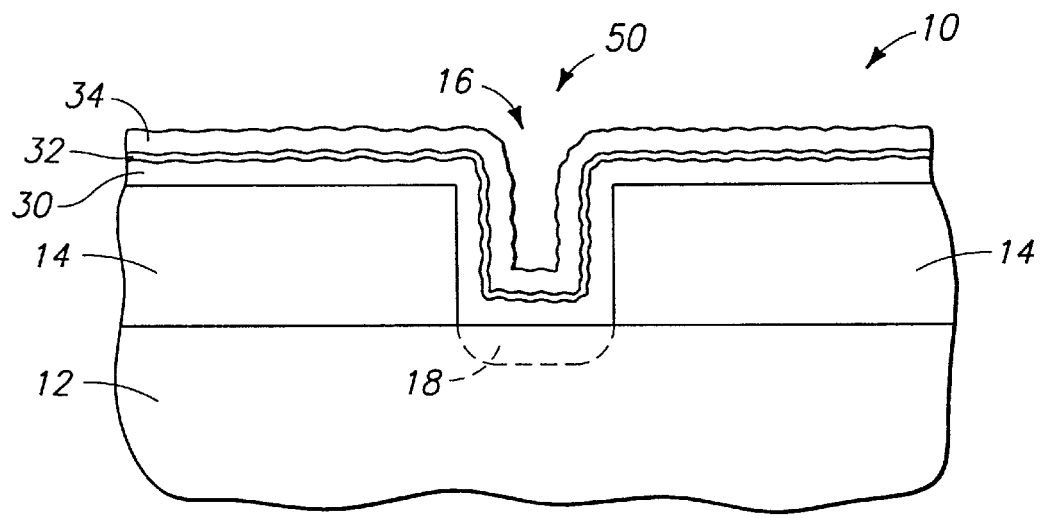
$\mathbb{F}\mathbb{I}\mathbb{G}$ 4

METHODS OF FORMING HEMISPHERICAL GRAIN POLYSILICON

RELATED PATENT DATA

This patent application is a continuation application resulting from U.S. patent application Ser. No. 09/018,228, which was an application filed on Feb. 3, 1998, now U.S. Pat. No. 6,083,849, which is a continuation-in-part of U.S. patent application Ser. No. 08/659,145, filed on Jun. 5, 1996, now U.S. Pat. No. 5,783,495 and hereby incorporated in its entirety by reference; which is a continuation-in-part of U.S. patent application Ser. No. 08/559,188, filed on Nov. 13, 1995, now abandoned and hereby incorporated in its entirety by reference.

TECHNICAL FIELD

This invention pertains to semiconductor processing methods in which materials are exposed to liquid solutions comprising fluorine-containing species.

BACKGROUND OF THE INVENTION

Many semiconductor fabrication processes comprise one or more steps wherein a material is exposed to fluorine-containing species. The fluorine-containing species can be, for example, in the form of hydrogen fluoride. An example use of hydrogen fluoride in semiconductor fabrication processes is to strip silicon dioxide from a surface. Another example use of hydrogen fluoride is to passivate a silicon surface (i.e., to react hydrogen with dangling silicon bonds).

Passivation of silicon surfaces and/or stripping of silicon dioxide can be utilized to enhance formation of hemispherical grain (HSG) polysilicon. Example HSG polysilicon fabrication processes are described in U.S. Pat. Nos. 5,634,974 and 5,691,228, which are incorporated herein by reference. Generally, the fabrication processes disclosed in such patents comprise forming a layer of amorphous silicon, passivating and/or cleaning the layer of amorphous silicon with hydrofluoric acid, and converting the amorphous silicon to HSG polysilicon. A method of converting amorphous silicon to HSG polysilicon comprises seeding the amorphous silicon by, for example, irradiation or doping, to form nucleation centers for subsequent growth of individual grains of HSG polysilicon. HSG polysilicon is grown from the nucleation centers by annealing the seeded amorphous silicon at, for example, a temperature of from about 200° C. to about 1500° C. and a pressure of from about $1 \times 10^{-8}$ Torr to about 1 atmosphere for a time of from about one second to about five hours.

The hydrofluoric acid treatments utilized in the above-described fabrication of HSG polysilicon either comprise an HF vapor clean, or a dip within an HF solution. If a dip is utilized, the temperature of the dip solution will be about 21.5° C. The dip solution is generally kept within a vessel configured to cool the dip solution to maintain a temperature of about 21.5° C. An advantage of the 21.5° C. temperature is that it is a temperature which has traditionally been used for HF dipping, and accordingly there is a large amount of information available pertaining to appropriate dipping times and conditions for various applications. Another advantage is that the equipment presently manufactured for dipping within HF solutions is configured to maintain a temperature of about 21.5° C. If the temperature were to vary significantly, it would introduce unwanted variability into a fabrication process.

It is desired to develop alternative methods of utilizing fluorine-containing species for treating materials during semiconductive fabrication processes.

SUMMARY OF THE INVENTION

In one aspect, the invention encompasses a semiconductor processing method wherein a surface is contacted with a liquid solution comprising one or more fluorine-containing species and a temperature of at least about 40° C.

In another aspect, the invention encompasses a method of passivating a silicon-comprising layer wherein the layer is contacted with a liquid solution comprising hydrogen fluoride and a temperature of at least about 40° C.

In another aspect, the invention encompasses a method of forming HSG polysilicon. A layer comprising substantially amorphous silicon is formed over a substrate. The layer comprising substantially amorphous silicon is contacted with a liquid solution comprising one or more fluorine-containing species and a temperature of at least about 40° C. The layer comprising substantially amorphous silicon is seeded and annealed to convert at least a portion of the layer to HSG polysilicon.

In yet another aspect, the invention encompasses a method of forming a wordline. A silicon layer is formed over a substrate. The silicon layer is passivated by contacting it with a liquid solution comprising hydrogen fluoride. The liquid solution is at a temperature of at least about 40° C. during the contacting. After the passivating, a silicide layer is formed over the silicon layer.

BRIEF DESCRIPTION OF THE DRAWINGS

Preferred embodiments of the invention are described below with reference to the following accompanying drawings.

FIG. 3 is a view of the FIG. 1 wafer fragment shown at a processing step subsequent to that of FIG. 2.

FIG. 4 is a view of the FIG. 1 wafer fragment shown at a processing step subsequent to that of FIG. 3.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

A first embodiment process of the present invention is described with reference to FIGS. 1–4, wherein the first embodiment process is a method of forming a capacitor.

Figure 1:
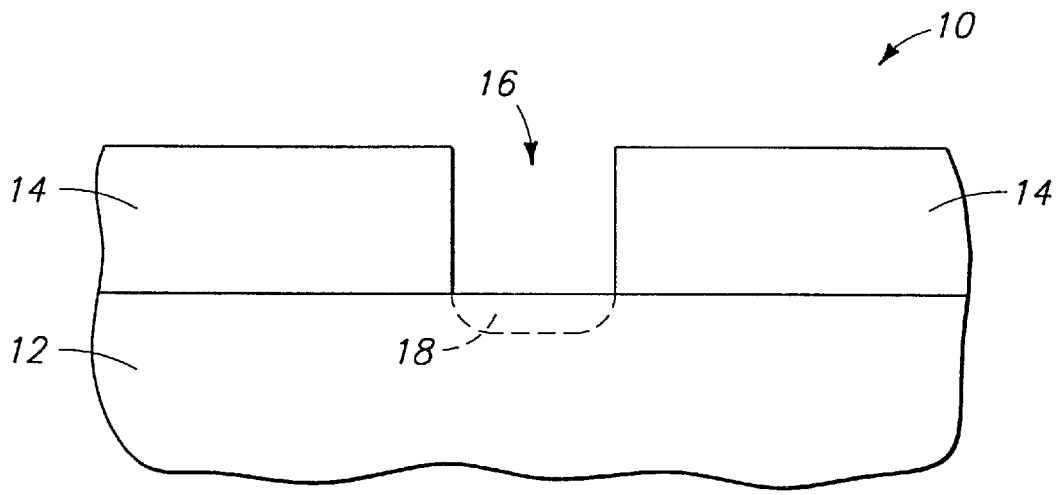
FIG. 1 is a fragmentary, diagrammatic, cross-sectional view of a semiconductor wafer fragment at a preliminary processing step of a method of the present invention.

Referring first to FIG. 1, a wafer fragment 10 comprises a substrate 12 and an insulative material 14 formed over substrate 12. Substrate 12 can comprise, for example, a monocrystalline silicon wafer lightly doped with a background p-type dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Insulative layer 14 can comprise, for example, borophosphosilicate glass (BPSG). An opening 16 is formed through insulative layer 14 and to substrate 12. A node location 18 is defined within substrate 12 at a bottom of opening 16. Node location 18 can comprise, for example, a conductively doped diffusion region within substrate 12. Such diffusion region can be formed either before or after formation of insulative layer 14 by conventional methods, such as, for example, ion implanting.

Figure 2:
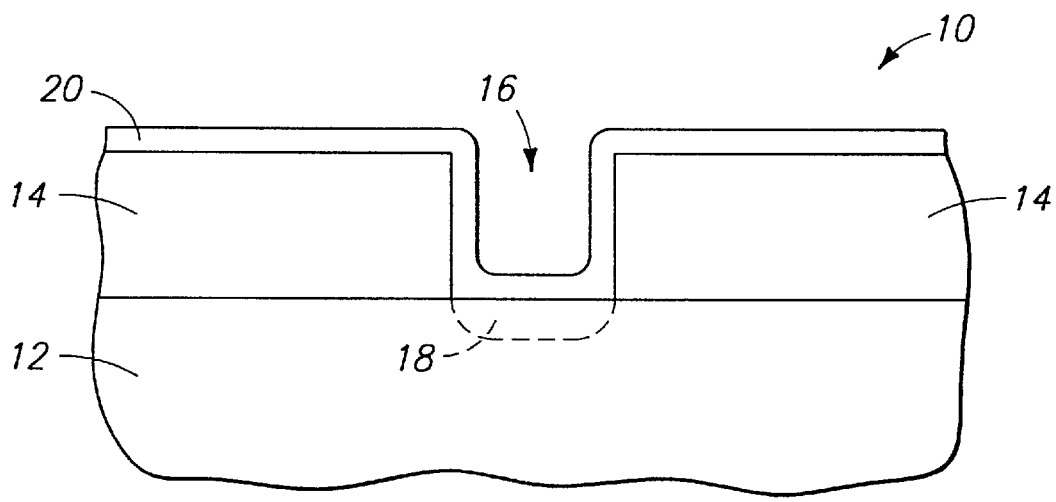
FIG. 2 is a view of the FIG. 1 wafer fragment shown at a processing step subsequent to that of FIG. 1.

Referring to FIG. 2, an amorphous silicon layer 20 is formed over insulative layer 14 and within opening 16. Amorphous silicon layer 20 can be formed by conventional methods, such as, for example, chemical vapor deposition. In accordance with the present invention, layer 20 is exposed to a liquid solution comprising one or more fluorine-containing species and maintained at a temperature of at least about 40° C. The liquid solution can be in the form of, for example, a liquid bath with the vast majority (greater than 99%) of the liquid in the bath comprising a temperature of at least about 40° C. Such bath will preferably be in a vessel configured to heat the bath to maintain the temperature of at least about 40° C. Thus, the bath will have a temperature of at least about 40° C. before contacting layer 20, and will maintain such temperature during contacting of layer 20.

Exposure of layer 20 to the liquid passivates and/or strips oxide from over layer 20. After the exposure to the liquid solution comprising fluorine-containing species, layer 20 is converted to an HSG layer 30 (shown in FIG. 3). The conversion to HSG layer can be accomplished by seeding and annealing procedure s, such as, for example, those described in U.S. Pat. Nos. 5,634,974 and 5,691,228.

The treatment of layer 20 with the liquid solution comprising fluorine-containing species can occur, for example, for a time of from about five seconds to about 20 minutes, with times of from about one minute to about two minutes being more preferred. It is to be understood, however, that treatment times are generally not critical to methods of the present invention. Accordingly, the present invention encompasses applications in which an upper limit of the treatment time can extend beyond 20 minutes. Also, treatment pressures are generally not critical to methods of the present invention, and treatment pressures can be higher, lower or equal to about one atmosphere.

A treatment liquid of the present invention is a liquid solution comprising fluorine-containing species. An example liquid solution comprising fluorine-containing species is a solution comprising from about 0.1% to about 49% hydrogen fluoride (by weight) and from about 51% to about 99.9% water (by weight). Such solutions can be formed, for example, by mixing commercial hydrogen fluoride solutions (generally obtained as a 49% (by weight) HF solution) with water. Another example liquid solution comprising fluorine-containing species is a solution comprising from about 0.1% to about 49% hydrogen fluoride (by weight), from about 28% to about 99.85% water (by weight), and from about 0.05% to about 23% tetramethyl ammonium hydroxide (TMAH) (by weight). Such solutions can be formed, for example, by mixing commercial hydrogen fluoride solutions (generally obtained as 49% (by weight) HF in water) with commercial TMAH solutions (generally obtained as 25% (by weight) TMAH in water), and water.

It can be advantageous to utilize liquid solutions comprising both TMAH and HF when differing materials are to be exposed to the liquid solutions, because the TMAH can equalize a rate at which HF etches differing materials. Specifically, the TMAH can form a diffusion barrier over surfaces as the surfaces are exposed to a mixture of HF and TMAH. The diffusion barrier can change a rate limiting step of an HF etch from etch chemistry to diffusion through the barrier layer, and can thereby equalize a rate at which hydrogen fluoride etches differing materials. For instance, if a wafer surface comprises silicon dioxide and BPSG, the BPSG and silicon dioxide surfaces will typically be etched at vastly different rates by HF. However, if TMAH is present, the TMAH will form a diffusion barrier over the BPSG and silicon dioxide surfaces. The HF will then need to diffuse through the barrier layer before etching the BPSG and silicon dioxide surfaces. If such diffusion through the barrier layer becomes a rate-limiting step, the barrier layer can equalize a rate at which the BPSG and silicon dioxide are etched.

Figure 8:
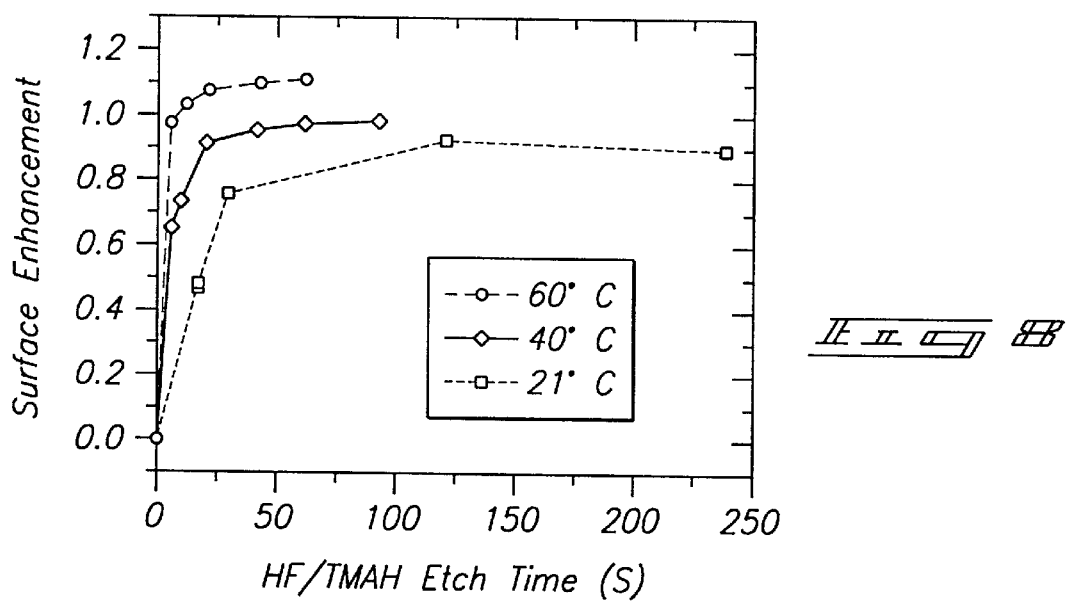
FIG. 8 is a graph of surface enhancement versus etch time, comparing silicon surfaces treated according to a method of the present invention with silicon surfaces treated according to prior art methods.

The present invention utilization of a liquid hydrogen fluoride solution at a temperature of at least about 40° C. can create significant advantages over prior art utilizations of liquid hydrogen fluoride solutions at about 21° C. For instance, the graph of FIG. 8 illustrates that processing temperatures above 40° C. significantly enhance the capacitive characteristics of a HSG polysilicon layer formed according to the method of the present invention relative to HSG polysilicon layers formed according to prior art methods. Specifically, FIG. 8 is a graph of surface enhancement versus etch time (i.e., exposure time to an HF solution) for various HSG layers. Surface enhancement is defined as $(Cap_{grain} - Cap_{flat})/Cap_{flat}$, wherein $Cap_{grain}$ refers to the capacitance of a capacitor formed with HSG generated from amorphous silicon exposed to liquid HF at an indicated temperature, and $Cap_{flat}$ refers to the capacitance of a capacitor formed from non-HSG polysilicon. Etch time is the time for which an amorphous silicon layer is exposed to a liquid solution comprising HF (specifically, HF and tetramethyl ammonium hydroxide (TMAH)), and comprising an indicated temperature. The graph indicates that treatment of amorphous silicon with an HF solution at temperatures above 40° C. will enhance capacitance of HSG formed from such amorphous silicon layers. The graph further indicates that the enhanced capacitance gained by treating amorphous silicon with liquid HF above 40° C. is beyond what can be achieved by conventional HF etching at about 21° C., regardless of how long the conventional etching lasts.

Referring to FIG. 4, HSG polysilicon layer 30 is incorporated into a capacitor construction 50. Specifically, a dielectric layer 32 and a capacitor plate layer 34 are formed over HSG polysilicon layer 30. Dielectric layer 32 can comprise, for example, silicon nitride and/or silicon dioxide, and can be formed by conventional methods, such as, for example chemical vapor deposition. Upper capacitor plate layer 34 can comprise, for example, conductively doped polysilicon, and can also be formed by conventional methods, such as, for example, chemical vapor deposition. Capacitor assembly 50 can be incorporated into integrated circuitry by methods known to persons of ordinary skill in the art.

Although the above-described method for forming a capacitor construction utilized an amorphous silicon layer 20 (shown in FIG. 2) which was subsequently converted to a HSG polysilicon layer 30 (shown in FIG. 3), it is to be understood that the invention can encompass other methods of forming a capacitor which are not shown. For instance, the layer 20 shown in FIG. 2 can be a polysilicon layer. Such polysilicon layer can be treated with a liquid solution comprising fluorine-containing species and a temperature of at least 40° C. in accordance with the method of the present invention to passivate the polysilicon layer. The polysilicon layer can then be incorporated directly into a capacitor structure, without converting the polysilicon layer to HSG polysilicon.

Figure 5:
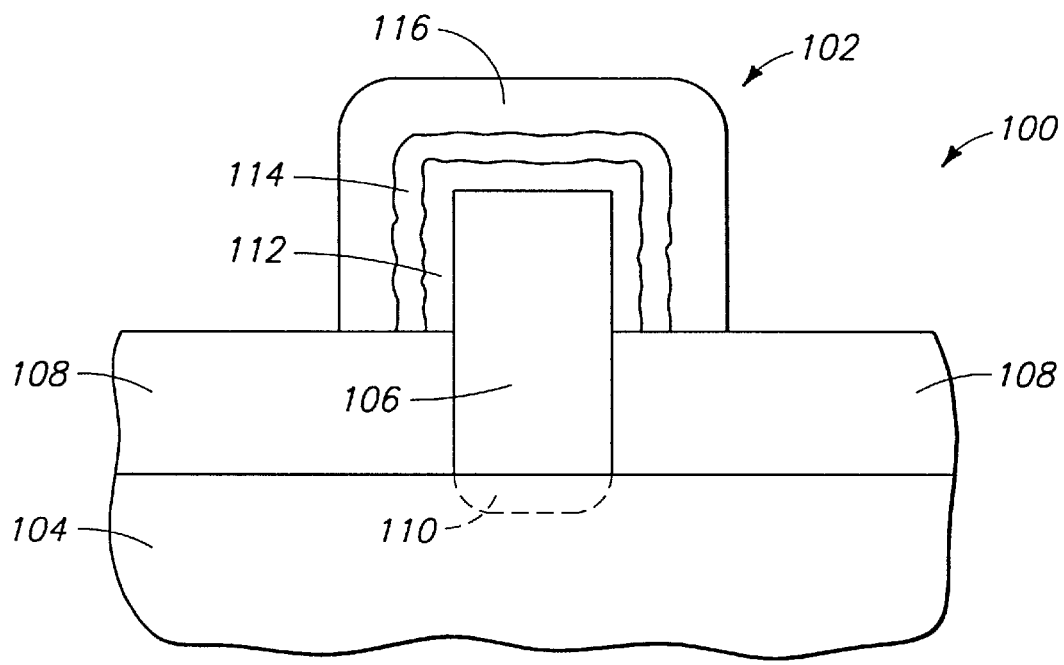
FIG. 5 is a fragmentary, diagrammatic, cross-sectional view of a semiconductor wafer fragment illustrating a capacitor construction formed by an alternative embodiment of the present invention.

The embodiment of FIGS. 1–4 illustrates a method of utilizing the present invention to form a container capacitor construction. The present invention also encompasses methods of forming alternative capacitor constructions. For instance, FIG. 5 illustrates a wafer fragment 100 comprising an alternative capacitor construction 102. Wafer fragment 100 comprises a substrate 104 and a conductive plug 106 formed over the substrate.

Substrate 104 can comprise, for example, monocrystalline silicon, and conductive plug 106 can comprise, for example, conductively doped polysilicon.

An insulating layer 108 is formed over substrate 104 and around plug 106. Insulating layer 108 can comprise, for example, silicon dioxide.

An electrical node 110 is formed within substrate 104 and against plug 106. Node 110 can comprise, for example, a diffusion region.

A first capacitor plate 112, dielectric layer 114 and second capacitor plate 116 are formed operatively adjacent plug 106 to form capacitor construction 102. First and second capacitor plates 112 and 116 can comprise, for example, conductively doped polysilicon, and first capacitor plate preferably comprises conductively doped hemispherical grain polysilicon. One or both of first and second capacitor plates 112 and 116 can be formed by a method comprising dipping a polysilicon layer in a bath comprising fluorine-containing species and a temperature of at least about 40° C. Dielectric layer 114 can comprise, for example, silicon nitride or silicon oxide.

The above-described embodiments are methods of forming a capacitor constructions. Another application in which HF dipping can be utilized to clean and passivate a surface is during formation of wordlines. Wordlines are commonly formed by first providing a layer of polysilicon, and subsequently providing a silicide layer over the polysilicon. The silicide layer can be formed, for example, by exposing a surface of the polysilicon to conditions which convert such surface to silicide. Frequently, it is desired to clean a polysilicon surface prior to forming silicide from such surface. A method of cleaning a polysilicon surface is to dip the polysilicon within a liquid solution comprising fluorine-containing species. In accordance with the present invention, such solution can comprise a temperature of at least about 40° C.

Figure 6:
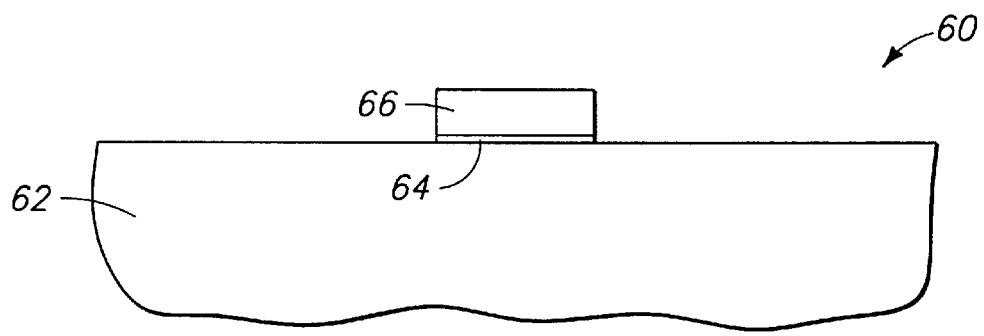
FIG. 6 is a fragmentary, diagrammatic, cross-sectional view of a semiconductor wafer fragment being processed according to a second embodiment method of the present invention.

A method of forming a wordline in accordance with the present invention is described with reference to FIGS. 6 and 7. Referring first to FIG. 6, a wafer fragment 60 comprises a substrate 62, a gate oxide layer 64 and a polysilicon wordline 66 formed over gate oxide 64. Substrate 62 can comprise, for example, monocrystalline silicon conductively doped with a background dopant. Gate oxide layer 64 can comprise, for example, silicon dioxide. Wordline 66 can comprise polysilicon conductively doped with a conductivity-enhancing impurity. As will be recognized by persons of ordinary skill in the art, wordline 66 can be formed by patterning a layer of polysilicon into a wordline shape. In accordance with the present invention, wordline 66 is treated with a liquid solution comprising fluorine-containing species and comprising a temperature of at least about 40° C. to passivate silicon within wordline 66. Treatment of the polysilicon of wordline 66 can occur before or after the patterning of a layer of polysilicon into the wordline shape.

Figure 7:
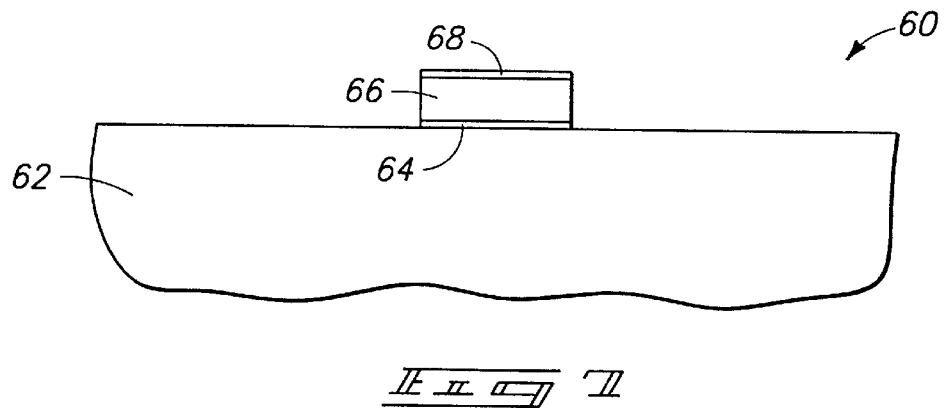
FIG. 7 is a view of the FIG. 6 wafer fragment at a processing step subsequent to that of FIG. 6.

Referring to FIG. 7, a silicide layer 68 is formed over the treated polysilicon of wordline 66. Silicide layer 68 can be formed by conventional methods such as, for example, by depositing a metal over an upper surface of the polysilicon of wordline 66 and reacting the metal with the silicon to form silicide layer 68. As will be recognized by persons of ordinary skill in the art, sidewalls of wordline 66 will generally be blocked by, for example, sidewall spacers, as a metal is formed over the upper surface of wordline 66 to prevent metal from depositing on the sides. Sidewall blocking materials are not shown in FIGS. 6 and 7 because they are not germane to the present invention, and because persons of ordinary skill in the art will readily recognize how and when to incorporate sidewall spacers into a method of the present invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming hemispherical grain polysilicon comprising exposing a silicon-containing layer to a liquid solution comprising at least one fluorine-containing species at a temperature of at least about 40 E C.

2. The method of claim 1 wherein exposing the silicon-containing layer to the liquid solution at a temperature of at least about 40 E C comprises providing the liquid solution in a vessel configured to heat the liquid solution to maintain the temperature thereof.

3. The method of claim 1 wherein the silicon of the silicon-containing layer is in the form of amorphous silicon.

4. The method of claim 1 wherein the liquid solution comprises hydrogen fluoride and TMAH.

5. The method of claim 1 wherein the liquid solution comprises from about 0.1% to about 49% hydrogen fluoride (by weight), from about 28% to about 99.85% water (by weight), and from about 0.05% to about 23% TMAH (by weight).

6. A method of forming hemispherical grain polysilicon comprising:

forming a layer overlying a substrate, the layer comprising amorphous silicon;

contacting the layer with a liquid solution comprising at least one fluorine-containing species, the liquid solution being maintained at a temperature of at least about 40° C. while contacting the first silicon layer; and converting at least a portion of the layer to hemispherical grain polysilicon.

7. The method of claim 6 wherein contacting the layer with a liquid solution comprises providing the liquid solution in a vessel configured to heat the solution to, and maintain the solution at, a temperature of at least about 40° C.

8. The method of claim 6 wherein converting at least a portion of the layer to hemispherical grain polysilicon comprises seeding the layer.

9. The method of claim 6 wherein greater than 99% of the liquid solution comprises the temperature of at least about 40° C. before contacting the layer.

10. The method of claim 6 wherein the liquid solution comprises hydrogen fluoride.

11. The method of claim 6 wherein the liquid solution comprises hydrogen fluoride and a diffusion barrier creating compound.

12. The method of claim 11 wherein the diffusion barrier creating compound comprises TMAH.

13. The method of claim 6 wherein the liquid solution comprises hydrogen fluoride and TMAH.

14. The method of claim 6 wherein the liquid solution comprises from about 0.1% to about 49% hydrogen fluoride (by weight) and from about 51% to about 99.9% water (by weight).

15. The method of claim 6 wherein the liquid solution comprises from about 0.1% to about 49% hydrogen fluoride (by weight), from about 28% to about 99.85% water (by weight), and from about 0.05% to about 23% TMAH (by weight).

16. A method of forming hemispherical grain polysilicon comprising:

forming an amorphous silicon-comprising layer overlying a monocrystalline silicon substrate;

contacting the amorphous silicon-comprising layer with an aqueous solution comprising from about 0.1% to about 49% hydrogen fluoride (by weight), the aqueous solution being maintained at a temperature of at least about 40° C. while contacting the amorphous silicon-comprising layer; and converting at least a portion of the amorphous silicon-comprising layer to hemispherical grain polysilicon.

17. The method of claim 16 wherein the aqueous solution comprises from about 0.05% to about 23% TMAH (by weight).

18. The method of claim 16 wherein converting at least a portion of the amorphous silicon-comprising layer to hemispherical grain polysilicon comprises annealing the amorphous silicon-comprising layer.

* * * * *

UNITED STATES PATENT AND TRADEMARK OFFICE
CERTIFICATE OF CORRECTION

PATENT NO. : 6,344,418 B1  Page 1 of 1
DATED : February 5, 2002
INVENTOR(S) : Er-Xuan Ping et al.

It is certified that error appears in the above-identified patent and that said Letters Patent is hereby corrected as shown below:

<u>Column 3,</u>
Line 46, replace "annealing procedure s, such as," with -- annealing procedures, such as, --

Signed and Sealed this

Sixteenth Day of July, 2002

*Attest:*

*Attesting Officer*

JAMES E. ROGAN
*Director of the United States Patent and Trademark Office*